(12) United States Patent
Nishida

(10) Patent No.: US 10,680,628 B2
(45) Date of Patent: Jun. 9, 2020

(54) ATOMIC OSCILLATOR AND FREQUENCY SIGNAL GENERATION SYSTEM

(71) Applicant: Seiko Epson Corporation, Tokyo (JP)

(72) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/142,044

(22) Filed: Sep. 26, 2018

(65) Prior Publication Data

US 2019/0097643 A1 Mar. 28, 2019

(30) Foreign Application Priority Data

Sep. 28, 2017 (JP) .................. 2017-188994

(51) Int. Cl.

| H01S 1/06 | (2006.01) |
| H03B 17/00 | (2006.01) |
| H03L 7/26 | (2006.01) |
| H03L 1/04 | (2006.01) |
| H01S 5/024 | (2006.01) |
| G01K 7/22 | (2006.01) |
| H01S 5/183 | (2006.01) |

(Continued)

(52) U.S. Cl.
CPC .............. *H03L 7/26* (2013.01); *G01K 7/02* (2013.01); *G01K 7/22* (2013.01); *H01S 5/02415* (2013.01); *H01S 5/0687* (2013.01); *H01S 5/06804* (2013.01); *H01S 5/183* (2013.01); *H03B 17/00* (2013.01); *H03L 1/04* (2013.01); *H01S 5/02216* (2013.01); *H01S 5/02248* (2013.01); *H01S 5/02453* (2013.01)

(58) Field of Classification Search
CPC .. H03L 7/26; H03L 1/04; H03B 17/00; H01S 5/02415; H01S 5/183; H01S 5/02248; H01S 5/02453; H01S 5/06804; H01S 5/0687; H01S 5/02216; G01K 7/22; G01K 7/02

USPC ................................... 331/3, 94.1
See application file for complete search history.

(56) References Cited

U.S. PATENT DOCUMENTS

| 2009/0066430 A1* | 3/2009 | Braun ............... G04F 5/14 331/94.1 |
| 2014/0293551 A1* | 10/2014 | Chindo .............. H01S 5/0687 361/728 |

(Continued)

FOREIGN PATENT DOCUMENTS

| JP | 2001-007437 A | 1/2001 |
| JP | 2015-119152 A | 6/2015 |
| JP | 2016-092146 A | 5/2016 |

*Primary Examiner* — Richard Tan
(74) *Attorney, Agent, or Firm* — Harness, Dickey & Pierce, P.L.C.

(57) ABSTRACT

An atomic oscillator includes a semiconductor laser housed in a container, an atom cell housing alkali metal atoms and irradiated with a light output from the semiconductor laser, a light receiving element that detects an intensity of the light transmitted through the atom cell and outputs a detection signal, a temperature sensor housed in the container, a first temperature control element housed in the container and controlled based on output of the temperature sensor, and a second temperature control element housed in the container and controlled based on the detection signal. A distance between the second temperature control element and the semiconductor laser is smaller than a distance between the first temperature control element and the semiconductor laser.

20 Claims, 5 Drawing Sheets

(51) Int. Cl.
 G01K 7/02 (2006.01)
 H01S 5/068 (2006.01)
 H01S 5/0687 (2006.01)
 H01S 5/022 (2006.01)

(56) References Cited

U.S. PATENT DOCUMENTS

2015/0180199 A1 6/2015 Shibata et al.
2016/0218727 A1 7/2016 Maki

* cited by examiner

ATOMIC OSCILLATOR AND FREQUENCY SIGNAL GENERATION SYSTEM

BACKGROUND

1. Technical Field

The present invention relates to an atomic oscillator and frequency signal generation system.

2. Related Art

Recently, atomic oscillators using CPT (Coherent Population Trapping) as a quantum interference effect have been proposed in the hopes of downsizing and lowering the power consumption of various apparatuses. The atomic oscillator using CPT is an oscillator using an electromagnetically induced transparency phenomenon (EIT phenomenon) that, when coherent lights having two different wavelengths (frequencies) are applied to alkali metal atoms, absorption of the coherent lights is stopped.

As an atomic oscillator using the EIT phenomenon, for example, JP-A-2015-119152 discloses an atomic oscillator that controls the frequency (wavelength) of a resonance light output from a light emitting device module based on the detection result of a photodetector that detects light transmitted through an atom cell.

In a semiconductor laser forming the light emitting device module, the light emission state, e.g., the oscillation wavelength or the like, varies due to temperature fluctuations. Accordingly, in the atomic oscillator of JP-A-2015-119152, the semiconductor laser is mounted on a Peltier element for reducing temperature fluctuations of the semiconductor laser, and the light emitting device is temperature-controlled with high accuracy.

In the atomic oscillator using CPT, it is necessary to control the wavelength of light output from a light source with high accuracy. In the case where a semiconductor laser is used for the light source as in the atomic oscillator of JP-A-2015-119152, the oscillation wavelength may be controlled by a drive current. However, when the drive current is varied for control of the oscillation wavelength of the semiconductor laser, light output of the semiconductor laser also varies. Variations of the light output of the semiconductor laser may cause frequency fluctuations (frequency fluctuations due to AC Stark effect) of the atomic oscillator and lower frequency stability of the atomic oscillator.

SUMMARY

An advantage of some aspects of the invention is to provide an atomic oscillator in which variations of light output of a semiconductor laser may be reduced. Another advantage of some aspects of the invention is to provide a system including the atomic oscillator.

The invention can be implemented as the following embodiments or application examples.

Application Example 1

An atomic oscillator according to this application example includes a semiconductor laser housed in a container, an atom cell housing alkali metal atoms and irradiated with a light output from the semiconductor laser, a light receiving element that detects intensity of the light transmitted through the atom cell and outputs a detection signal, a temperature sensor housed in the container, a first temperature control element housed in the container and controlled based on output of the temperature sensor, and a second temperature control element housed in the container and controlled based on the detection signal, wherein a distance between the second temperature control element and the semiconductor laser is smaller than a distance between the first temperature control element and the semiconductor laser.

In the atomic oscillator, the distance between the second temperature control element and the semiconductor laser is smaller than the distance between the first temperature control element and the semiconductor laser, accordingly, the temperature of the semiconductor laser is controlled using the second temperature control element, and thereby, the temperature of the semiconductor laser may be controlled faster than in the case where the temperature of the semiconductor laser is control led using the first temperature control element. Therefore, in the atomic oscillator, the control of the oscillation wavelength of the semiconductor laser may be performed by control of the second temperature control element based on the detection signal of the light receiving element.

Here, in the case where the oscillation wavelength of the semiconductor laser is controlled by the temperature of the semiconductor laser, the fluctuations of the light output of the semiconductor laser are extremely small compared to the case where the oscillation wavelength of the semiconductor laser is controlled by a drive current. Therefore, according to the atomic oscillator, the fluctuations of the light output of the semiconductor laser by the control of the oscillation wavelength of the semiconductor laser may be reduced.

Application Example 2

The atomic oscillator according to the application example may include a light output control circuit that controls light output of the semiconductor laser by supplying a current to the semiconductor laser based on the detection signal, and a wavelength control circuit that controls an oscillation wavelength of the semiconductor laser by supplying a current to the second temperature control element based on the detection signal.

In the atomic oscillator, the light output of the semiconductor laser may be controlled by the drive current of the semiconductor laser, and the oscillation wavelength of the semiconductor laser may be controlled by the temperature of the semiconductor laser.

Application Example 3

In the atomic oscillator according to the application example, the second temperature control element may be mounted on the first temperature control element, and the semiconductor laser may be mounted on the second temperature control element.

In the atomic oscillator, the influence by the environmental temperature on the semiconductor laser and the second temperature control element may be reduced by the first temperature control element, and the temperature of the semiconductor laser may be controlled faster by the second temperature control element.

Application Example 4

In the atomic oscillator according to the application example, the first temperature control element may be a Peltier element, and the second temperature control element may be a heater.

In the atomic oscillator, the first temperature control element is the Peltier element and may accommodate a wide range of environmental temperatures. Further, the second temperature control element is the heater and, for example, compared to the case where a Peltier element is used as the second temperature control element, the element may be downsized and simplified.

Application Example 5

In the atomic oscillator according to the application example, the second temperature control element may be placed on a temperature control surface of the first temperature control element, and the semiconductor laser may be placed on a surface of the second temperature control element on an opposite side to a surface on the temperature control surface side.

In the atomic oscillator, the influence by the environmental temperature on the semiconductor laser and the second temperature control element may be reduced by the first temperature control element, and the temperature of the semiconductor laser may be controlled faster by the second temperature control element.

Application Example 6

In the atomic oscillator according to the application example, the heat capacity of the second temperature control element may be smaller than the heat capacity of the first temperature control element.

The temperature control element has control responsiveness as the heat capacity is smaller, and thus, in the atomic oscillator, the temperature of the semiconductor laser is controlled using the second temperature control element, and thereby, the temperature of the semiconductor laser may be controlled faster than in the case using the first temperature control element.

Application Example 7

A system according to this application example is a system including an atomic oscillator, and the atomic oscillator includes a semiconductor laser housed in a container, an atom cell housing alkali metal atoms and irradiated with a light output from the semiconductor laser, a light receiving element that detects intensity of the light transmitted through the atom cell and outputs a detection signal, a temperature sensor housed in the container, a first temperature control element housed in the container and controlled based on output of the temperature sensor, and a second temperature control element housed in the container and controlled based on the detection signal, wherein a distance between the second temperature control element and the semiconductor laser is smaller than a distance between the first temperature control element and the semiconductor laser.

The system includes the atomic oscillator in which the fluctuations of the light output of the semiconductor laser may be reduced, and may have better reliability.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Embodiments of the invention will now be explained in detail with reference to the drawings. Note that the embodiments to be explained below do not limit the scope of the invention described in the Claims. Further, not all of the configurations to be explained are necessarily essential components of the invention.

1. Atomic Oscillator 1.1. Configuration of Atomic Oscillator

Figure 1:
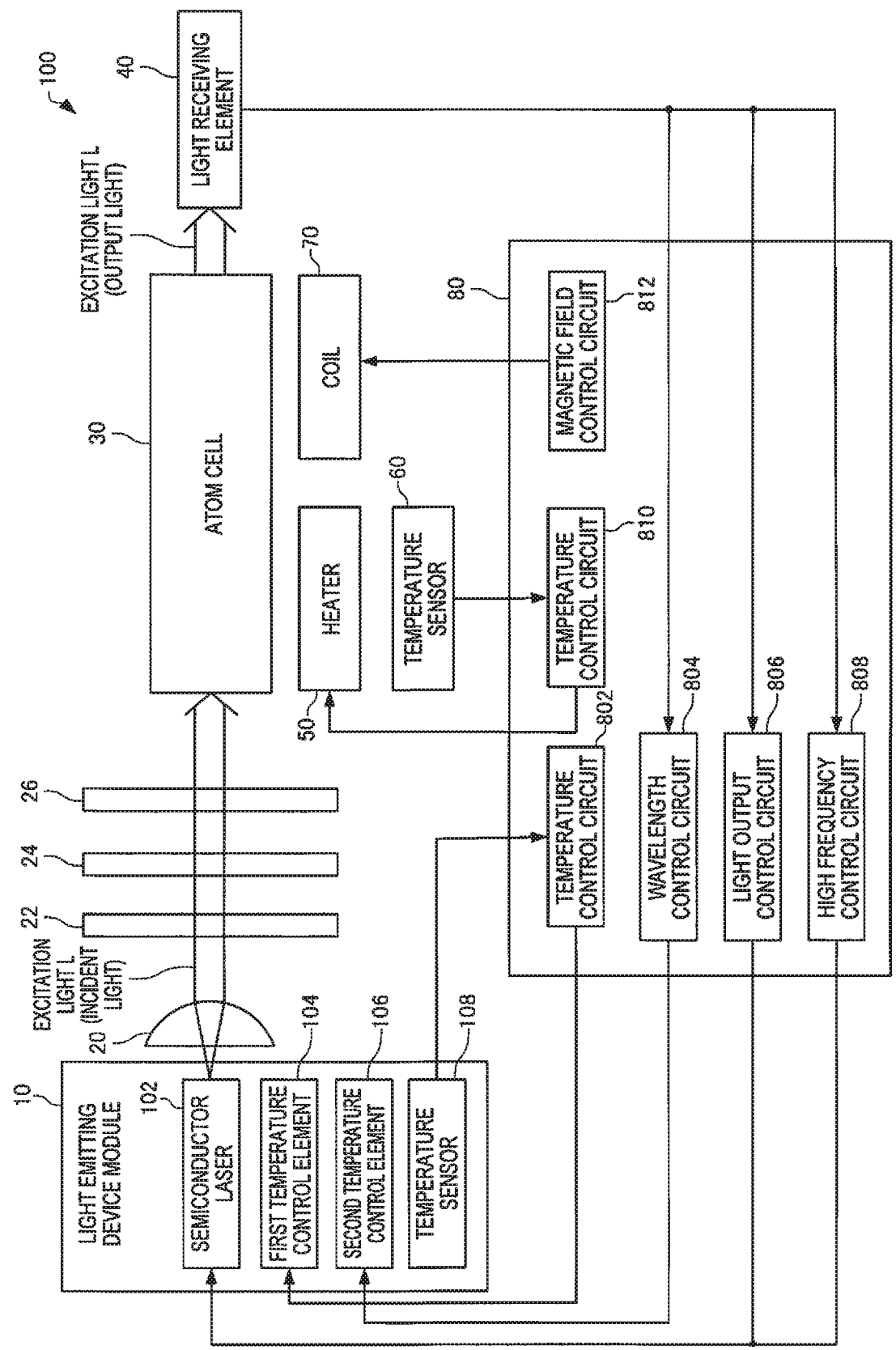
FIG. 1 is a functional block diagram of an atomic oscillator according to an embodiment.
Figure 2:
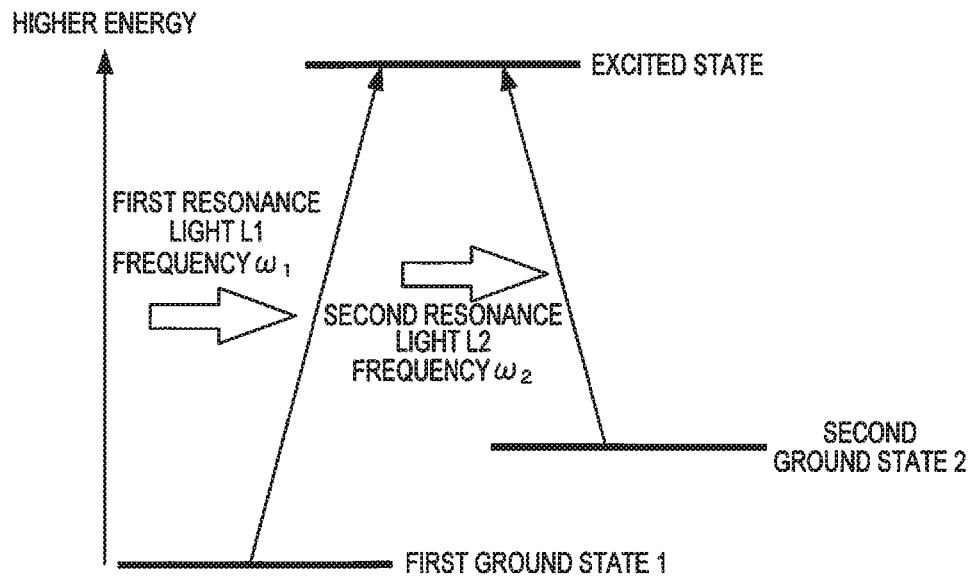
FIG. 2 is a diagram for explanation of energy states of an alkali metal atom within an atom cell.
Figure 3:
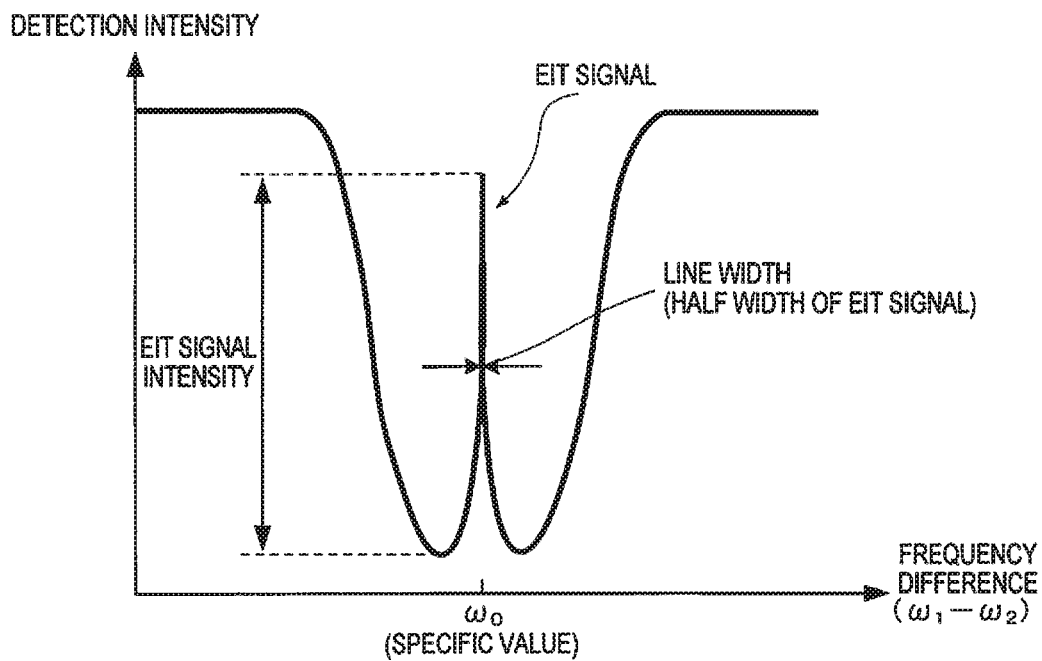
FIG. 3 is a graph showing a relationship between a frequency difference between two lights output from a semiconductor laser and detection intensity detected in a light receiving element.

First, a configuration of an atomic oscillator according to an embodiment will be explained with reference to the drawings. FIG. 1 is a functional block diagram of an atomic oscillator 100 according to the embodiment. FIG. 2 is a diagram for explanation of energy states of an alkali metal atom within an atom cell 30 of the atomic oscillator 100 according to the embodiment. FIG. 3 is a graph showing a relationship between a frequency difference between two lights output from a semiconductor laser 102 and detection intensity detected in a light receiving element 40 in the atomic oscillator 100 according to the embodiment.

The atomic oscillator 100 is an atomic oscillator using a quantum interference effect. The atomic oscillator 100 using the quantum interference effect may be downsized compared to an atomic oscillator using a double resonance effect.

As shown in FIG. 1, the atomic oscillator 100 includes a light emitting device module 10, optical components 20, 22, 24, 26, the atom cell 30, the light receiving element 40, a heater 50, a temperature sensor 60, a coil 70, and a controller 80.

First, the principle of the atomic oscillator 100 is explained.

In the atomic oscillator 100, alkali metal atoms of gaseous rubidium, cesium, sodium, or the like are enclosed within the atom cell 30.

As shown in FIG. 2, an alkali metal atom has energy levels of a three-level system and may be in three states. The three states are two ground states at two different energy levels (first ground state 1 and second ground state 2) and an excited state. Here, the first ground state 1 is an energy state lower than the second ground state 2.

When a first resonance light L1 and a second resonance light L2 having different frequencies from each other are applied to the gaseous alkali metal atoms, light absorptance (light transmittance) of the first resonance light L1 and the second resonance light L2 in the alkali metal atoms changes according to a difference (($\omega_1 - \omega_2$)) between the frequency $\omega_1$ of the first resonance light L1 and the frequency $\omega_2$ of the second resonance light L2. When the difference ($\omega_1 - \omega_2$)

between the frequency $\omega_1$ of the first resonance light L1 and the frequency $\omega_2$ of the second resonance light L2 coincides with the frequency corresponding to an energy difference between the first ground state 1 and the second ground state 2, excitation from the ground states 1, 2 respectively stops. In this regard, both the first resonance light L1 and the second resonance light L2 are not absorbed by the alkali metal atoms, but are transmitted through the atoms. The phenomenon is called a CPT phenomenon or electromagnetically induced transparency phenomenon (EIT).

Here, for example, in the case where the frequency $\omega_1$ of the first resonance light L1 is fixed and the frequency $\omega_2$ of the second resonance light L2 is changed, when the difference ($\omega_1-\omega_2$) between the frequency $\omega_1$ of the first resonance light L1 and the frequency $\omega_2$ of the second resonance light L2 coincides with the frequency $\omega_0$ corresponding to the energy difference between the first ground state 1 and the second ground state 2, the detection intensity of the light receiving element 40 steeply increases as shown in FIG. 3. The steep signal is called an EIT signal. The EIT signal has an eigenvalue determined depending on the kind of alkali metal atom. Therefore, a high-accuracy oscillator may be formed using the EIT signal as a reference.

The respective parts of the atomic oscillator 100 will now be explained.

Light Emitting Device Module

The light emitting device module 10 outputs excitation light L that excites the alkali metal atoms within the atom cell 30. Specifically, the light emitting device module 10 outputs the above described two kinds of light (first resonance light L1 and second resonance light L2) having different frequencies as the excitation light L.

The first resonance light L1 excites the alkali metal atoms within the atom cell 30 from the above described first ground state 1 to the excited state. On the other hand, the second resonance light L2 excites the alkali metal atoms within the atom cell 30 from the above described second ground state 2 to the excited state.

The light emitting device module 10 includes the semiconductor laser 102, a first temperature control element 104, a second temperature control element 106, and a temperature sensor 108. The details of the light emitting device module 10 will be described later.

Optical Components

The optical components 20, 22, 24, 26 are provided along an optical path of the excitation light L between the light emitting device module 10 and the atom cell 30. In the example shown in FIG. 1, the first optical component 20, the second optical component 22, the third optical component 24, and the fourth optical component 26 are sequentially placed (aligned) from the light emitting device module 10 toward the atom cell 30.

The first optical component 20 is a lens. The first optical component 20 may apply the excitation light L to the atom cell 30 without waste. The first optical component 20 has a function of parallelizing the excitation light L. Accordingly, reflection of the excitation light L by the inner walls of the atom cell 30 may be suppressed. Thereby, the excitation light L within the atom cell 30 is preferably resonated and, as a result, the oscillation characteristics of the atomic oscillator 100 may be improved.

The second optical component 22 is a polarizer. The second optical component 22 may adjust the polarization of the excitation light L from the light emitting device module 10 in a predetermined direction.

The third optical component 24 is a dimming filter, i.e., an ND filter (Neutral Density Filter). The third optical component 24 may adjust (reduce) the intensity of the excitation light L entering the atom cell 30. Accordingly, even when the light output of the light emitting device module 10 is larger, the amount of the excitation light L entering the atom cell 30 may be adjusted to a desired amount.

The fourth optical component 26 is a $\lambda/4$-wave plate. The fourth optical component 26 may convert the excitation light L from the light emitting device module 10 from linearly-polarized light into circularly-polarized light (right circularly-polarized light or left circularly-polarized light). The excitation light L is converted into circularly-polarized light, and thereby, the number of atoms that express the desired EIT phenomenon may be increased in the Zeeman splitting condition of the alkali metal atoms within the atom cell 30. As a result, the intensity of the desired EIT signal may be increased and the oscillation characteristics of the atomic oscillator 100 may be improved.

Atom Cell

The gaseous alkali metal atoms are enclosed in the atom cell 30. The excitation light L output from the semiconductor laser 102 of the light emitting device module 10 is applied to the atom cell 30 via the optical components 20, 22, 24, 26. Note that part of the alkali metal atoms enclosed within the atom cell 30 may exist in a gaseous state and the rest may exist in a liquid or solid state as excess. Further, as desired, a rare gas of argon, neon, or the like or an inert gas of nitride or the like may be enclosed as a buffer gas with the gaseous alkali metal atoms in the atom cell 30.

The atom cell 30 has a main body with a columnar through hole and a pair of windows that air-tightly seal both openings of the through hole (not shown). Thereby, an internal space containing the alkali metal atoms is formed. The material forming the main body is not particularly limited, but a metal material, resin material, glass material, silicon material, crystal quartz, or the like may be used. In view of workability and joining to the window portions, a glass material or silicon material is preferably used. The windows are formed using a material that transmits the excitation light L. As the material forming the window portions, quartz glass, borosilicate glass, or the like may be used.

Light Receiving Element

The light receiving element 40 detects the intensity of the excitation light L (first resonance light L1 and second resonance light L2) transmitted through the atom cell 30 and outputs detection signals according to the intensity of the light. As the light receiving element 40, a solar cell, photodiode, or the like may be used.

Heater

The heater 50 heats the atom cell 30 (more specifically, the alkali metal atoms housed in the atom cell 30). Thereby, the alkali metal atoms within the atom cell 30 may be maintained in a gaseous state at a desired concentration. The heater 50 generates heat by energization (direct current) and includes, for example, a heating resistor.

The heater 50 may be in contact with the atom cell 30 or not as long as the heater may heat the atom cell 30. Or, the atom cell 30 may be heated using a Peltier element in place of the heater 50 or in combination with the heater 50.

Temperature Sensor

The temperature sensor 60 detects the temperature of the heater 50 or the atom cell 30. The amount of heat generation of the heater 50 is controlled based on the detection result of the temperature sensor 60. Thereby, the alkali metal atoms within the atom cell 30 may be maintained at a desired temperature. The position at which the temperature sensor 60 is placed is not particularly limited, but may be on the heater 50 or on the outer surface of the atom cell 30, for example. As the temperature sensor 60, a known temperature sensor such as a thermistor or thermocouple may be used.

Coil

The coil 70 generates a magnetic field that Zeeman-splits the degenerated energy levels of the alkali metal atoms within the atom cell 30. The coil 70 may expand the gaps between the degenerated different energy levels of the alkali metal atoms and improve resolution by the Zeeman splitting. As a result, the accuracy of the oscillation frequency of the atomic oscillator 100 may be made higher.

The coil 70 is, for example, a Helmholtz coil placed with the atom cell 30 therein or a solenoid coil placed to cover the atom cell 30. The coil 70 may generate a unidirectionally homogeneous magnetic field within the atom cell 30. Note that the magnetic field generated by the coil 70 is a constant magnetic field (direct-current magnetic field), however, an alternating-current magnetic field may be superimposed thereon.

Controller

The controller 80 controls the light emitting device module 10, the heater 50, and the coil 70. The controller 80 has a temperature control circuit 802 that controls the first temperature control element 104 based on the output of the temperature sensor 108, a wavelength control circuit 804 that controls the oscillation wavelength (the center wavelength of the excitation light L) of the semiconductor laser 102, a light output control circuit 806 that controls the light output of the semiconductor laser 102, and a high-frequency control circuit 808 that controls the high-frequency signal input to the semiconductor laser 102. Further, the controller 80 has a temperature control circuit 810 that controls the temperature of the alkali metal atoms housed in the atom cell 30, and a magnetic field control circuit 812 that controls the magnetic field generated by the coil 70.

The temperature control circuit 802, the wavelength control circuit 804, the light output control circuit 806, and the high-frequency control circuit 808 for controlling the light emitting device module 10 will be explained in "1.3. Operation of Atomic Oscillator" later.

The temperature control circuit 810 controls energization of the heater 50 based on the detection result of the temperature sensor 60. Thereby, the atom cell 30 may be maintained within a desired temperature range (e.g., around 70° C.)

The magnetic field control circuit 812 controls energization to the coil 70 so that the magnetic field generated by the coil 70 may be constant.

The controller 80 is provided on, for example, an IC chip mounted on a substrate (not shown).

Note that, as the respective control circuits 802, 804, 806, 808, 810, 812 forming the controller 80, a processor (CPU (Central Processing Unit) or the like) may be used. That is, the control of the light emitting device module 10, the heater 50, and the coil 70 may be performed by execution of programs stored in a memory device (not shown) using the processor.

1.2. Configuration of Light Emitting Device Module

Figure 4:
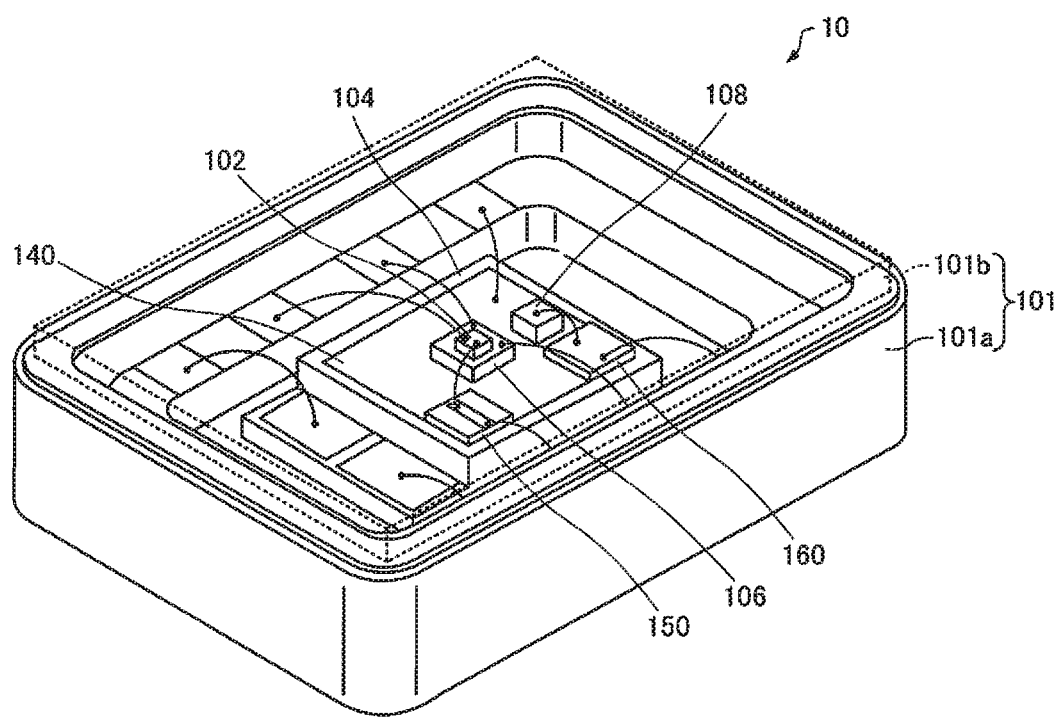
FIG. 4 is a perspective view schematically showing a light emitting device module.
Figure 5:
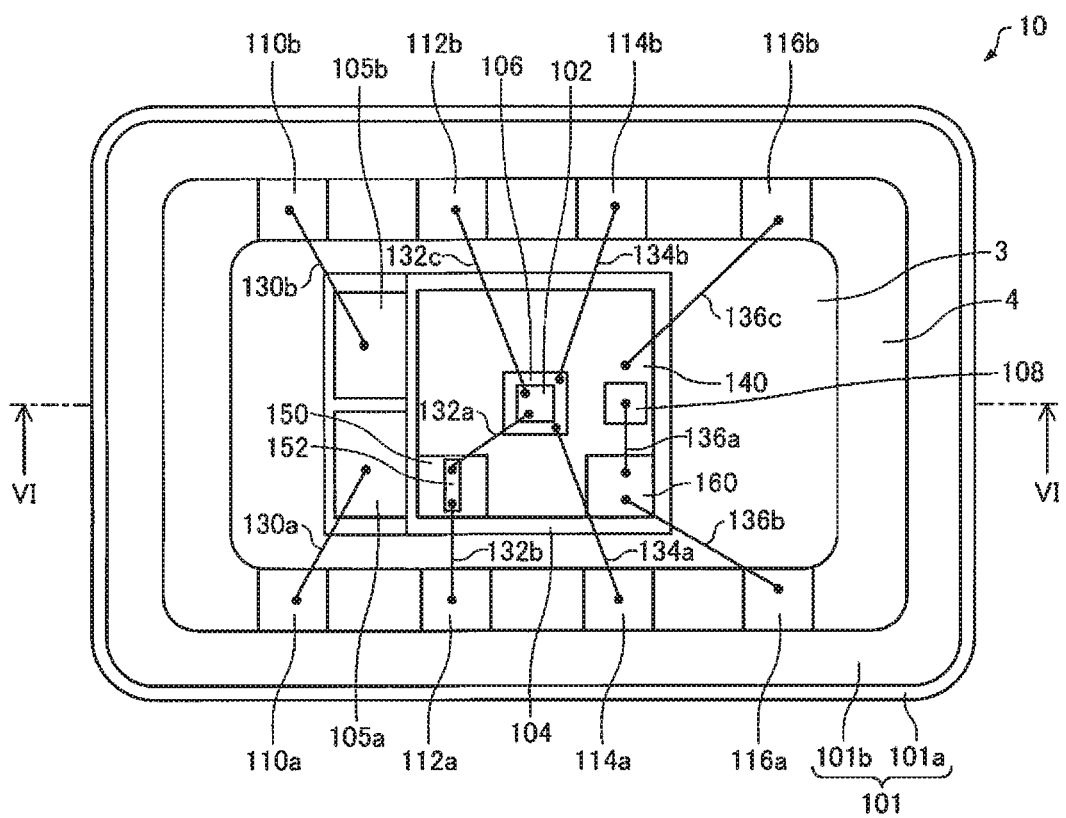
FIG. 5 is a plan view schematically showing the light emitting device module.
Figure 6:
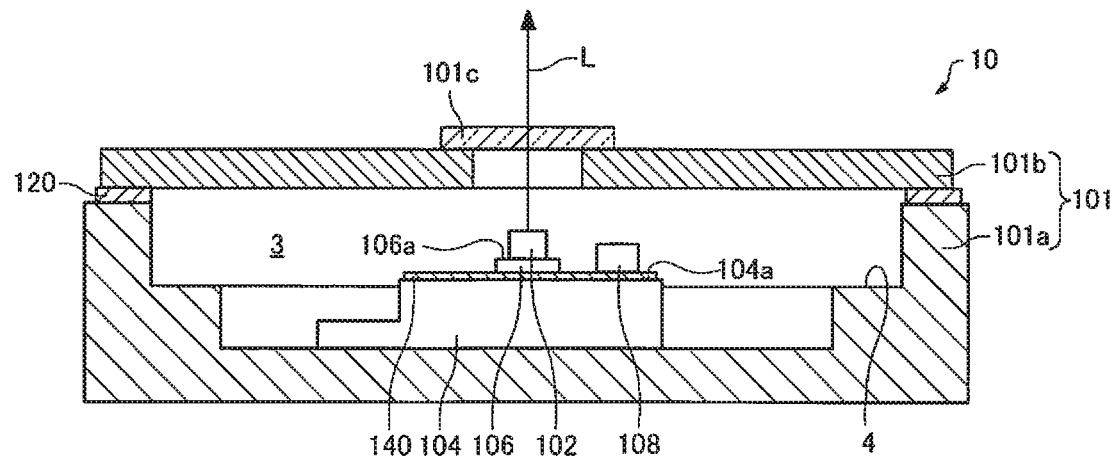
FIG. 6 is a sectional view schematically showing the light emitting device module.

Next, a configuration of the light emitting device module 10 will be explained with reference to the drawings. FIG. 4 is a perspective view schematically showing the light emitting device module 10. FIG. 5 is a plan view schematically showing the light emitting device module 10. FIG. 6 is a sectional view schematically showing the light emitting device module 10. Note that FIG. 6 is a sectional view along line VI-VI in FIG. 5. For convenience, FIGS. 4 and 5 show the module as seen through a lid 101b.

As shown in FIGS. 4 to 6, the light emitting device module 10 includes the semiconductor laser 102, the first temperature control element 104, the second temperature control element 106, and the temperature sensor 108. The light emitting device module 10 further includes a package (container) 101 housing the semiconductor laser 102, the first temperature control element 104, the second temperature control element 106, and the temperature sensor 108. Note that, in the specification, the positional relationship in the light emitting device module 10 is explained with the lid side as the upside and the base side as the downside relatively.

The package 101 has a base 101a having a concavity 3 and the lid 101b closing the opening of the concavity 3. The concavity 3 closed by the lid 101b functions as a housing space housing the semiconductor laser 102, the first temperature control element 104, the second temperature control element 106, and the temperature sensor 108. The housing space is preferably in a vacuum state, i.e., in a state at lower pressure than the atmosphere. Thereby, the influence of temperature changes outside of the package 101 (environmental temperature change) on the semiconductor laser 102, the temperature sensor 108, and the like within the package 101 may be reduced, and temperature fluctuations of the semiconductor laser 102, the temperature sensor 108, and the like may be reduced. Note that the housing space is not necessarily in a vacuum state, but the housing space may be filled with an inert gas of nitride, helium, argon, or the like.

It is preferable that the base 101a has an insulation property, and is formed using a material suitable for air-tight sealing of the housing space. The material of the base 101a can be various ceramics including oxide ceramics such as alumina, silica, titania, and zirconia, nitride ceramics such as silicon nitride, aluminum nitride, and titanium nitride, and carbide ceramics such as silicon carbide. Note that, as the material of the base 101a, the same metal material as that of the lid 101b may be used.

The base 101a has a step 4 formed on the upper side (lid 101b side) relative to the bottom surface of the concavity 3. on the step 4, a pair of connection electrodes 110a, 110b electrically connected to the first temperature control element 104, a pair of connection electrodes 112a, 112b electrically connected to the semiconductor laser 102, a pair of connection electrodes 114a, 114b electrically connected to the second temperature control element 106, and a pair of connection electrodes 116a, 116b electrically connected to the temperature sensor 108 are provided. These connection electrodes 110a, 110b, 112a, 112b, 114a, 114b, 116a, 116b are respectively electrically connected to an externally mounted electrode (not shown) provided on the lower surface of the base 101a, i.e., the surface of the base 101a farther from the lid 101b via through electrodes (not shown).

The materials of the connection electrodes 110a, 110b, 112a, 112b, 114a, 114b, 116a, 116b, the externally mounted electrode, and the through electrodes are not particularly limited, but may be metal materials including gold, gold alloy, platinum, aluminum, aluminum alloy, silver, silver alloy, chromium, chromium alloy, nickel, copper, molybdenum, niobium, tungsten, iron, titanium, cobalt, zinc, and zirconium.

A metallization layer 120 in a frame shape is provided on the upper end surface of the base 101a. The metallization layer 120 increases adhesion to a brazing filler metal.

Thereby, the joining strength between the base 101a and the lid 101b by the brazing filler metal may be increased.

The material of the metallization layer 120 is not particularly limited as long as the material may increase the adhesion to the brazing filler metal, but may be a metal material including the materials of the above described connection electrodes 110a, 110b, 112a, 112b, 114a, 114b, 116a, 116b etc.

The lid 101b has a plate shape. A through hole is formed in the lid 101b, and the through hole is sealed by a window 101c having transmissivity for the excitation light L. The lid 101b is joined to the base 101a by welding to the metallization layer 120 using the brazing filler metal. The material of the brazing filler metal is not particularly limited, but may be gold solder or silver solder.

The material of the lid 101b (except the window member 101c) is not particularly limited, but a metal material is preferably used and a metal material having a coefficient of linear expansion close to that of the constituent material of the base 101a is more preferably used. Therefore, for example, when the base 101a is a ceramic board, the material of the lid 101b is preferably an alloy of kovar or the like.

The window 101c is placed in the optical path of the excitation light L output from the semiconductor laser 102. The window 101c has a plate shape in the illustrated example. The shape of the window 101c is not limited to the plate shape, but may have a curved surface to function as a lens. The material of the window member 101c is preferably glass.

The first temperature control element 104 is placed on the bottom surface of the concavity 3 of the base 101a. The first temperature control element 104 is fixed to the base 101a using an adhesive agent.

In the embodiment, the first temperature control element 104 is a Peltier element. One surface (the lower surface, the surface on the bottom surface side of the concavity 3) of the pair of surfaces of the first temperature control element 104 is fixed to the base 101a, and the other surface (the upper surface, the surface on the lid 101b side) forms a temperature control surface 104a to be temperature-controlled. The second temperature control element 106 and the temperature sensor 108 are placed on the temperature control surface 104a of the first temperature control element 104.

The first temperature control element 104 has a pair of surfaces including one surface on the heat generation side (heat generation surface) and the other surface on the heat absorption side (heat absorption surface). The first temperature control element 104 controls the direction of the supplied current, and thereby, may set the temperature control surface 104a as the heat generation surface or the heat absorption surface. Accordingly, even when the range of the environmental temperatures is wide, the semiconductor laser 102 may be controlled to desired temperatures. The temperature of the temperature control surface 104a is determined according to the characteristics of the semiconductor laser 102. Note that "environmental temperature(s)" refers to a temperature to which a certain component is subjected, i.e., an ambient temperature of a certain component. Here, the environmental temperature is the ambient temperature of the semiconductor laser 102, which may have an influence on the light output from the semiconductor laser 102.

The first temperature control element 104 has a pair of terminals 105a, 105b. The terminal 105a is electrically connected to the connection electrode 110a via a wire 130a, and the terminal 105b is electrically connected to the connection electrode 110b via a wire 130b. Thereby, the first temperature control element 104 may be driven by supplying current (electric power) to the pair of terminals 105a, 105b. The wires 130a, 130b are bonding wires.

A metal layer 140 formed using a metal having higher heat conduction such as aluminum, gold, silver, or the like is placed on the temperature control surface 104a of the first temperature control element 104, and the second temperature control element 106 and the temperature sensor 108 are placed on the surface of the metal layer 140. That is, the second temperature control element 106 and the temperature sensor 108 are placed on the temperature control surface 104a via the metal layer 140. Note that the second temperature control element 106 and the temperature sensor 108 may be placed directly on the temperature control surface 104a.

The second temperature control element 106 is mounted on the first temperature control element 104. The second temperature control element 106 has a surface on the temperature control surface 104a side and a surface (placement surface) 106a on the opposite side to the surface on the temperature control surface 104a side. The semiconductor laser 102 is placed on the placement surface 106a of the second temperature control element 106. That is, in the light emitting device module 10, the second temperature control element 106 is placed on the first temperature control element 104, and the semiconductor laser 102 is placed on the second temperature control element 106. The second temperature control element 106 is located between the first temperature control element 104 and the semiconductor laser 102. Accordingly, the semiconductor laser 102 does not contact the temperature control surface 104a (metal layer 140) of the first temperature control element 104.

The planar size of the second temperature control element 106 is smaller than the planar size of the first temperature control element 104. Accordingly, an entirety of the second temperature control element 106 may be placed on the temperature control surface 104a of the first temperature control element 104. Thereby, as will be described later, the distance between the second temperature control element 106 and the semiconductor laser 102 may be made smaller than the distance between the first temperature control element 104 and the semiconductor laser 102.

In the embodiment, the second temperature control element 106 is a heater. As the second temperature control element 106, a known heater such as a heating resistor or ceramic heater may be used.

The temperature of the second temperature control element 106 (the temperature of the placement surface 106a) is controlled to be at a higher temperature than the temperature of the temperature control surface 104a of the first temperature control element 104. Thereby, the temperature of the semiconductor laser 102 can be lowered by control of the current supplied to the second temperature control element 106 (heater).

In the atomic oscillator 100, the control of the oscillation wavelength of the semiconductor laser 102 (control of the center wavelength of the excitation light L) is performed by control of the temperature of the semiconductor laser 102 by the second temperature control element 106. Accordingly, it is preferable that the second temperature control element 106 controls the temperature of the semiconductor laser 102 quickly so that feedback control for stabilizing the center wavelength of the excitation light L (the oscillation wavelength of the semiconductor laser 102) at a wavelength corresponding to the bottom of the absorption, which will be described later, can be performed. In other words, it is preferable that the temperature of the semiconductor laser 102 may be changed in a short amount of time.

Therefore, in the embodiment, the distance between the second temperature control element 106 and the semiconductor laser 102 is smaller than the distance between the first temperature control element 104 and the semiconductor laser 102. Thereby, the second temperature control element 106 may transmit the generated heat to the semiconductor laser 102 in a shorter time compared to the first temperature control element 104. Further, the second temperature control element 106 may locally control the temperature of the semiconductor laser 102 compared to the first temperature control element 104. Thus, the temperature of the semiconductor laser 102 may be controlled faster.

Note that the distance between the second temperature control element 106 and the semiconductor laser 102 refers to the shortest distance between the second temperature control element 106 and the semiconductor laser 102, and the distance between the first temperature control element 104 and the semiconductor laser 102 refers to the shortest distance between the first temperature control element 104 and the semiconductor laser 102. Further, the distances between the temperature control elements 104, 106 and the semiconductor laser 102 refer to the shortest distances between the parts that control the temperature of the semiconductor laser 102 of the temperature control elements 104, 106 and the semiconductor laser 102. The parts that control the temperature of the semiconductor laser 102 of the temperature control elements 104, 106 refer to parts controlled at predetermined temperatures of the parts at temperatures that change by heat generation, heat absorption, or the like. For example, the first temperature control element 104 is the Peltier element and the surfaces that generate or absorb heat are the surfaces in contact with the temperature control surface 104a and the base 101a. Of the surfaces, the temperature control surface 104a is controlled at the predetermined temperature, and, in this case, the distance between the first temperature control element 104 and the semiconductor laser 102 is the shortest distance between the temperature control surface 104a and the semiconductor laser 102.

Further, in the embodiment, the heat capacity of the second temperature control element 106 is smaller than the heat capacity of the first temperature control element 104. The temperature control element such as a Peltier element or heater generally has higher control responsiveness as the heat capacity is smaller. That is, the response speed to the control input is higher. Accordingly, the temperature of the semiconductor laser 102 is controlled using the second temperature control element 106, and thereby, the temperature of the semiconductor laser 102 may be controlled faster than that in the case using the first temperature control element 104. In the light emitting device module 10, a smaller temperature control element than the first temperature control element 104 is used as the second temperature control element 106, and thereby, the heat capacity of the second temperature control element 106 is made smaller.

In the feedback control for stabilizing the center wavelength of the excitation light L (the oscillation wavelength of the semiconductor laser 102) at the wavelength corresponding to the bottom of the absorption, it is desirable to control the temperature of the semiconductor laser 102 with accuracy from about several millikelvins to several tens of millikelvins. Accordingly, the second temperature control element 106 is mounted on the first temperature control element 104 (the second temperature control element 106 is placed on the temperature control surface 104a), and thereby, the temperature control range of the second temperature control element 106 may be made narrower (e.g., about ±1° C.) and higher temperature control accuracy from about several millikelvins to several tens of millikelvins may be realized. For example, the temperature of the temperature control surface 104a of the first temperature control element 104 is set to 35° C. and the semiconductor laser 102 is temperature-controlled in a range of 36±1° C. by the second temperature control element 106. The temperature control range of the second temperature control element 106 is made narrower as described above, and thereby, the temperature control accuracy may be relatively improved and higher temperature control accuracy may be realized.

The second temperature control element 106 has a pair of terminals (not shown). One of the pair of terminals is electrically connected to the connection electrode 114a via a wire 134a. The other of the pair of terminals is electrically connected to the connection electrode 114b via a wire 134b. Thereby, the second temperature control element 106 may be driven by supplying current (electric power) to the pair of terminals of the second temperature control element 106. The wires 134a, 134b are bonding wires.

The semiconductor laser 102 is mounted on the second temperature control element 106. The semiconductor laser 102 is preferably a vertical cavity surface-emitting laser (VCSEL). The semiconductor laser 102 is used with superimposition (modulation) of a high-frequency signal on a direct-current bias current, and thereby, outputs the above described two kinds of light (first resonance light L1 and second resonance light L2) having different frequencies as the excitation light L.

The semiconductor laser 102 has a pair of terminals (not shown). One terminal of the pair of terminals is a terminal for drive signal and the other is a terminal for grounding. The terminal for drive signal is electrically connected to the connection electrode 112a via a wire 132a, a wiring layer 152 provided in a relay member 150, and a wire 132b. The terminal for grounding is electrically connected to the connection electrode 112b via a wire 132c. The wires 132a, 132b, 132c are bonding wires. Current (electric power) is supplied to the semiconductor laser 102 by the electrical connection between the semiconductor laser 102 and the connection electrodes 112a, 112b, and thereby, the semiconductor laser 102 may be driven.

The relay member 150 has an insulation property. The material of the relay member 150 is, for example, ceramic. The wiring layer 152 provided in the relay member 150 intervenes in the middle of the wire connecting the semiconductor laser 102 and the connection electrode 112a (between the wire 132a and the wire 132b). Thereby, the wires 132a, 132b may be thermally connected to the temperature control surface 104a of the first temperature control element 104 and the temperature fluctuations of the wires 132a, 132b may be reduced.

The temperature sensor 108 is mounted on the first temperature control element 104. The temperature sensor 108 detects the temperature of the first temperature control element 104 or semiconductor laser 102. As the temperature sensor 108, a thermistor or thermocouple may be used.

The temperature sensor 108 has a pair of terminals (not shown). One terminal of the pair of terminals is a terminal for detection signal and the other is a terminal for grounding. The terminal for detection signal is electrically connected to the connection electrode 116a via a wire 136a, a wiring layer (not shown) provided in a relay member 160, and a wire 136b. The terminal for grounding is electrically connected to the connection electrode 116*b* via a wire 136*c*. The wires 136*a*, 136*b*, 136*c* are bonding wires.

The relay member 160 has an insulation property. The material of the relay member 160 is, for example, ceramic. The wiring layer provided in the relay member 160 intervenes in the middle of the wire connecting the temperature sensor 108 and the connection electrode 116*a* (between the wire 136*a* and the wire 136*b*). Thereby, the wires 136*a*, 136*b* may be thermally connected to the temperature control surface 104*a* of the first temperature control element 104 and the temperature fluctuations of the wires 136*a*, 136*b* may be reduced.

1.3. Operation of Atomic Oscillator

First, the temperature control circuit 802, the wavelength control circuit 804, the light output control circuit 806, and the high-frequency control circuit 808 for controlling the light emitting device module 10 will be explained.

The temperature control circuit 802 controls energization of the first temperature control element 104 based on the detection result of the temperature sensor 108. Thereby, even when the environmental temperature range is wide, the semiconductor laser 102 may be adjusted to a desired temperature. The temperature control circuit 802 controls the first temperature control element 104 based on the output of the temperature sensor 108 so that the temperature of the temperature control surface 104*a* of the first temperature control element 104 may be at a desired temperature (e.g., 35° C.), for example.

The wavelength control circuit 804 controls the oscillation wavelength of the semiconductor laser 102 (i.e., the center wavelength of the excitation light L) by supplying the current to the second temperature control element 106 based on the signal intensity of the detection signal output by the light receiving element 40. The wavelength control circuit 804 controls the oscillation wavelength of the semiconductor laser 102 so that the center wavelength (frequency) of the excitation light L generated by the semiconductor laser 102 may be stabilized at a desired wavelength (frequency).

The wavelength control circuit 804 controls the oscillation wavelength of the semiconductor laser 102 by controlling the second temperature control element 106. That is, the oscillation wavelength of the semiconductor laser 102 is controlled by control of the temperature of the semiconductor laser 102.

Specifically, the wavelength control circuit 804 supplies the current (electric power) so that the temperature of the second temperature control element 106 (heater) may be at a temperature higher by about several degrees Celsius than the temperature of the temperature control surface 104*a* of the first temperature control element 104 in the initial state. For example, when the temperature of the temperature control surface 104*a* is 35° C., the temperature of the second temperature control element 106 in the initial state is set to about 36° C. Further, to lengthen the wavelength of the semiconductor laser 102, the wavelength control circuit 804 increases the current (electric power) supplied to the second temperature control element 106 to raise the temperature of the semiconductor laser 102. To shorten the wavelength of the semiconductor laser 102, the wavelength control circuit 804 decreases the current (electric power) supplied to the second temperature control element 106 to lower the temperature of the semiconductor laser 102.

The light output control circuit 806 controls the light output of the semiconductor laser 102 by supplying the current (drive current) to the semiconductor laser 102 based on the signal intensity of the detection signal output by the light receiving element 40. The light output refers to the intensity of light output from the semiconductor laser 102, i.e., the intensity of light directly output from the semiconductor laser 102 without any influence by another optical component. The light output control circuit 806 controls the semiconductor laser 102 so that the light output (light intensity of excitation light L) of the semiconductor laser 102 may be constant. Specifically, the light output control circuit 806 controls the light output of the semiconductor laser 102 so that the minimum value (bottom of absorption) of the signal intensity of the detection signal of the light receiving element 40 may be at a predetermined value.

The high-frequency control circuit 808 controls the supply of the high-frequency signal to the semiconductor laser 102. The high-frequency control circuit 808 controls the frequency of the high-frequency signal to be at a frequency corresponding to a half of $(\omega_1-\omega_2)$ of the alkali metal atom.

Next, the operation of the atomic oscillator 100 will be explained. First, the initial operation of activating the atomic oscillator 100 in a halted condition is explained.

The light output control circuit 806 changes the light output of the semiconductor laser 102 based on the signal intensity of the detection signal output by the light receiving element 40. Specifically, the light output control circuit 806 changes the light output of the semiconductor laser 102 so that the minimum value (bottom of absorption) of the signal intensity of the detection signal when the center wavelength of the excitation light L is changed may be at a predetermined value.

Then, the high-frequency control circuit 808 inputs the high-frequency signal to the semiconductor laser 102. In this regard, the frequency of the high-frequency signal is slightly shifted to prevent expression of the EIT phenomenon. For example, when cesium is used as the alkali metal atoms of the atom cell 30, the frequency is shifted from 4.596 . . . GHz.

Then, the wavelength control circuit 804 sweeps the center wavelength of the excitation light L. In this regard, the frequency of the high-frequency signal is set to prevent expression of the EIT phenomenon, and the EIT phenomenon is not expressed. When sweeping the center wavelength of the excitation light L, the wavelength control circuit 804 detects the minimum value (bottom of absorption) of the signal intensity of the detection signal output from the light receiving element 40. For example, the wavelength control circuit 804 detects the value at which the signal intensity change of the detection signal relative to the center wavelength of the excitation light L becomes a fixed rate or less as the bottom of absorption.

The wavelength control circuit 804 detects the bottom of absorption and fixes (locks) the center wavelength of the excitation light L. That is, the wavelength control circuit 804 fixes the center wavelength of the excitation light L to the wavelength corresponding to the bottom of absorption.

Then, the high-frequency control circuit 808 adjusts the frequency of the high-frequency signal to the frequency at which the EIT phenomenon is expressed. Subsequently, the high-frequency control circuit 808 moves to a loop operation, and synchronously detects the detection signal output by the light receiving element 40 and detects the EIT signal.

Next, the loop operation of the atomic oscillator 100 is explained.

The high-frequency control circuit 808 detects the EIT signal by synchronous detection of the detection signal output by the light receiving element 40, and controls the frequency of the high-frequency signal to be at the frequency corresponding to the half of $(\omega_1-\omega_2)$ of the alkali metal atom of the atom cell 30.

The wavelength control circuit 804 performs feedback control for stabilizing the center wavelength of the excitation light L at the wavelength corresponding to the bottom of the absorption. Specifically, the wavelength control circuit 804 synchronously detects the detection signal output by the light receiving element 40 and controls the second temperature control element 106 so that the center wavelength of the excitation light L may be at the wavelength corresponding to the bottom of the absorption.

The light output control circuit 806 performs feedback control so that the light output of the semiconductor laser 102 may be constant. For example, the light output control circuit 806 synchronously detects the detection signal output by the light receiving element 40 and, if the minimum value (bottom of absorption) of the signal intensity of the detection signal is smaller than the predetermined value, supplies the drive current to the semiconductor laser 102 so that the minimum value (bottom of absorption) of the signal intensity of the detection signal may be at the predetermined value. Note that, even when the center wavelength of the excitation light L differs from the wavelength corresponding to the bottom of the absorption by the control using the light output control circuit 806, the center wavelength of the excitation light L may be adjusted to the wavelength corresponding to the bottom of the absorption by the control using the wavelength control circuit 804.

The atomic oscillator 100 includes the following features.

The atomic oscillator 100 includes the first temperature control element 104 controlled based on the output of the temperature sensor 108 and the second temperature control element 106 controlled based on the detection signal output by the light receiving element 40, and the distance between the second temperature control element 106 and the semiconductor laser 102 is smaller than the distance between the first temperature control element 104 and the semiconductor laser 102. Accordingly, in the atomic oscillator 100, the temperature of the semiconductor laser 102 is controlled using the second temperature control element 106, and thereby, the temperature of the semiconductor laser 102 may be controlled faster than in the case where the temperature of the semiconductor laser 102 is controlled using the first temperature control element 104. Therefore, in the atomic oscillator 100, the feedback control for stabilizing the center wavelength of the excitation light L (the oscillation wavelength of the semiconductor laser 102) at the wavelength corresponding to the bottom of the absorption may be performed by control of the second temperature control element 106 based on the detection signal of the light receiving element 40.

Here, in the case where the oscillation wavelength of the semiconductor laser 102 is varied by the temperature of the semiconductor laser 102, the fluctuations of the light output of the semiconductor laser 102 are extremely small compared to the case where the oscillation wavelength of the semiconductor laser 102 is varied by a drive current. Specifically, in the case where the oscillation wavelength of the semiconductor laser 102 is varied by the temperature of the semiconductor laser 102, fluctuations of the light output of the semiconductor laser 102 are about 1/30th compared to the case where the oscillation wavelength of the semiconductor laser 102 is varied by the drive current. Accordingly, the oscillation wavelength of the semiconductor laser 102 is controlled by the temperature of the semiconductor laser 102, and thereby, the fluctuations of the light output of the semiconductor laser 102 by the control of the oscillation wavelength of the semiconductor laser 102 may be reduced.

As described above, according to the atomic oscillator 100, the fluctuations of the light output of the semiconductor laser 102 by the control of the oscillation wavelength of the semiconductor laser 102 may be reduced. As a result, frequency fluctuations of the atomic oscillator due to the fluctuations of the light output of the semiconductor laser 102 (frequency fluctuations due to AC Stark effect) may be reduced, and an atomic oscillator with better frequency stability may be realized.

Note that the temperature control of the semiconductor laser 102 using only the first temperature control element 104 without the second temperature control element 106 has been considered. However, high control responsiveness is required for the control of the oscillation wavelength of the semiconductor laser 102. The first temperature control element 104 has a role of keeping the semiconductor laser 102 at the desired temperature in a wide range of environmental temperatures (e.g., from −10° C. to 60° C.), and a temperature control element having a larger heat capacity is preferably used. The control responsiveness of the temperature control element generally becomes worse as the heat capacity is larger. Accordingly, if the temperature control of the semiconductor laser 102 is performed using only the first temperature control element 104 without the second temperature control element 106, it may be impossible to perform appropriate feedback control because the response is slower.

According to the atomic oscillator 100, as described above, the two temperature control elements (first temperature control element 104 and second temperature control element 106) are used, and thereby, a wider range of environmental temperatures may be accommodated and the fluctuations of the light output of the semiconductor laser 102 by the control of the oscillation wavelength of the semiconductor laser 102 may be reduced. Thus, an atomic oscillator with better frequency stability may be realized.

In the atomic oscillator 100, the light output control circuit 806 controls the light output of the semiconductor laser 102 by supplying the current to the semiconductor laser 102 based on the detection signal of the light receiving element 40. Further, in the atomic oscillator 100, the wavelength control circuit 804 controls the oscillation wavelength of the semiconductor laser 102 by supplying the current to the second temperature control element 106 based on the detection signal of the light receiving element 40. Accordingly, in the atomic oscillator 100, the light output of the semiconductor laser 102 may be controlled by the drive current of the semiconductor laser 102, and the oscillation wavelength of the semiconductor laser 102 may be controlled by the temperature of the semiconductor laser 102.

For example, if the oscillation wavelength of the semiconductor laser 102 is controlled by the drive current of the semiconductor laser 102, the light output of the semiconductor laser 102 may fluctuate by the control of the oscillation wavelength of the semiconductor laser 102. Accordingly, for example, when the light output of the semiconductor laser 102 changes with age, if the drive current is controlled for returning the light output of the semiconductor laser 102 to the initial value, the oscillation wavelength also varies. The same problem arises when the oscillation wavelength of the semiconductor laser 102 changes with age and when both the light output and the oscillation wavelength of the semiconductor laser 102 change with age. As described above, if the oscillation wavelength of the semiconductor laser 102 is controlled by the drive current of the semiconductor laser 102, it may be impossible to compensate for the long-term changes of the light output and the oscillation wavelength of the semiconductor laser 102, and the long-term stability of the atomic oscillator may be lower.

On the other hand, in the atomic oscillator 100, the oscillation wavelength of the semiconductor laser 102 may be controlled by the control of the temperature of the semiconductor laser 102 and the light output of the semiconductor laser 102 may be controlled by the drive current of the semiconductor laser 102, and thereby, the above described phenomenon does not occur and an atomic oscillator with better long-term stability may be realized.

Further, in the atomic oscillator 100, the light output control circuit 806 controls the light output of the semiconductor laser 102 based on the detection signal of the light receiving element 40, and thus, even if it may be impossible for the temperature sensor 108 to correctly measure the temperature due to aging degradation or the like (for example, the measurement result is 34.9° C. though the actual temperature is 35° C.), the light output of the semiconductor laser 102 may be controlled so that the minimum value (bottom of absorption) of the signal intensity of the detection signal may be at the predetermined value. As described above, in the atomic oscillator 100, the fluctuations of the light output of the semiconductor laser 102 because correct temperature measurement by the temperature sensor 108 is impossible due to aging degradation or the like may be compensated.

In the atomic oscillator 100, the second temperature control element 106 is mounted on the first temperature control element 104 and the semiconductor laser 102 is mounted on the second temperature control element 106. Accordingly, in the atomic oscillator 100, the influence by the environmental temperature on the semiconductor laser 102 and the second temperature control element 106 may be reduced by the first temperature control element 104, and the temperature of the semiconductor laser 102 may be controlled faster by the second temperature control element 106.

In the atomic oscillator 100, the first temperature control element 104 is a Peltier element and may accommodate a wide range of environmental temperatures. Further, in the atomic oscillator 100, the second temperature control element 106 is a heater, and, for example, compared to the case where a Peltier element is used as the second temperature control element 106, the element may be downsized and simplified.

In the atomic oscillator 100, the second temperature control element 106 is placed on the temperature control surface 104a of the first temperature control element 104, and the semiconductor laser 102 is placed on the surface 106a of the second temperature control element 106 on the opposite side to the surface of the temperature control surface 104a side. Accordingly, in the atomic oscillator 100, the influence of the environmental temperature on the semiconductor laser 102 and the second temperature control element 106 may be reduced by the first temperature control element 104, and the temperature of the semiconductor laser 102 may be controlled faster by the second temperature control element 106.

1.4. Modified Examples

Note that the invention is not limited to the above described embodiment, but various modifications can be made within the scope of the invention. In the following modified examples, the members having the same functions as the component members of the above described atomic oscillator 100 have the same reference numerals and a detailed explanation thereof will be omitted.

For example, in the above described embodiment, the case where the first temperature control element 104 is the Peltier element is explained, however, the first temperature control element 104 is not limited to that as long as the element may control the temperature of the semiconductor laser 102 at a desired temperature. The first temperature control element 104 may be, for example, a known heater such as a heating resistor or ceramic heater.

Further, for example, in the above described embodiment, the case where the second temperature control element 106 is the heater is explained, however, the second temperature control element 106 is not limited to that as long as the element may have control responsiveness that enables feedback control for setting the temperature of the semiconductor laser 102 so that the center wavelength of the excitation light L (the oscillation wavelength of the semiconductor laser 102) may be at the wavelength corresponding to the bottom of the absorption. The second temperature control element 106 may be, for example, a Peltier element.

Furthermore, in the above described embodiment, the case where the second temperature control element 106 is mounted on the first temperature control element 104 and the semiconductor laser 102 is placed on the second temperature control element 106 is explained, however, the placement of the first temperature control element 104, the second temperature control element 106, and the semiconductor laser 102 is not limited to only that configuration. It is only desired that the distance between the second temperature control element and the semiconductor laser is smaller than the distance between the first temperature control element and the semiconductor laser. For example, the first temperature control element 104, the second temperature control element 106, and the semiconductor laser 102 may be sequentially placed on the base 101a of the package 101. Or, the first temperature control element 104 and the second temperature control element 106 may be placed on the base 101a and the semiconductor laser 102 may be placed on the second temperature control element 106.

2. Frequency Signal Generation System

Figure 7:
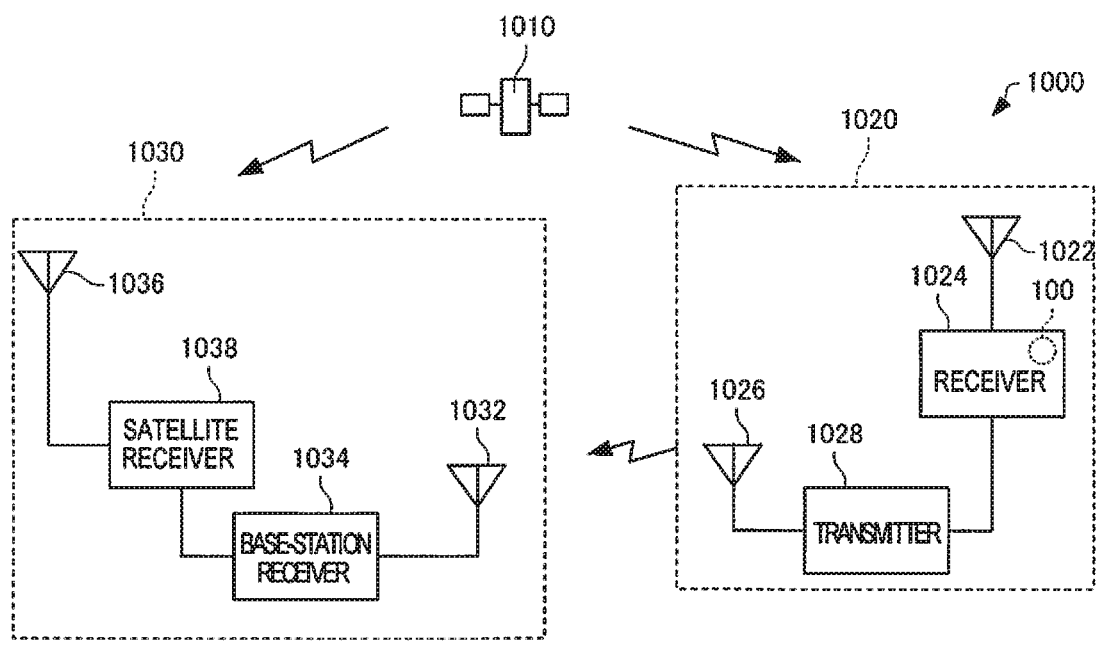
FIG. 7 is a diagram for explanation of an example of a system according to an embodiment.

Next, a frequency signal generation system according to the embodiment will be explained with reference to the drawings. The system includes the above described atomic oscillator. Note that, in the specification, both an apparatus including the atomic oscillator and a system including the apparatus and another apparatus are referred to as frequency signal generation systems. Below, a positioning system including the atomic oscillator 100 will be explained as the frequency signal generation system according to the invention. FIG. 7 is a diagram for explanation of a positioning system 1000 using a GPS (Global Positioning System) satellite as an example of the frequency signal generation system according to the embodiment. In the embodiment, abase station apparatus 1020 or the positioning system 1000 corresponds to the frequency signal generation system.

As shown in FIG. 7, the positioning system 1000 includes the base station apparatus 1020 and a GPS receiving apparatus 1030.

The GPS satellite 1010 transmits positioning satellite signals (GPS signals).

The base station apparatus 1020 includes a receiver 1024 that accurately receives positioning information from a GPS satellite 1010 via an antenna 1022 installed at an electronic reference point (GPS continuous observation station), and a transmitter 1028 that transmits the positioning information received by the receiver 1024 via an antenna 1026. The receiver 1024 has the atomic oscillator 100 as a reference frequency oscillation source. The positioning information received by the receiver 1024 is transmitted by the transmitter 1028 in real time.

The GPS receiving apparatus 1030 includes a satellite receiver 1034 that receives the positioning information from the GPS satellite 1010 via an antenna 1032 and a base-station receiver 1038 that receives the positioning information from the base station apparatus 1020 via an antenna 1036.

The positioning system 1000 includes the atomic oscillator 100 with better frequency stability and has better reliability.

Figure 8:
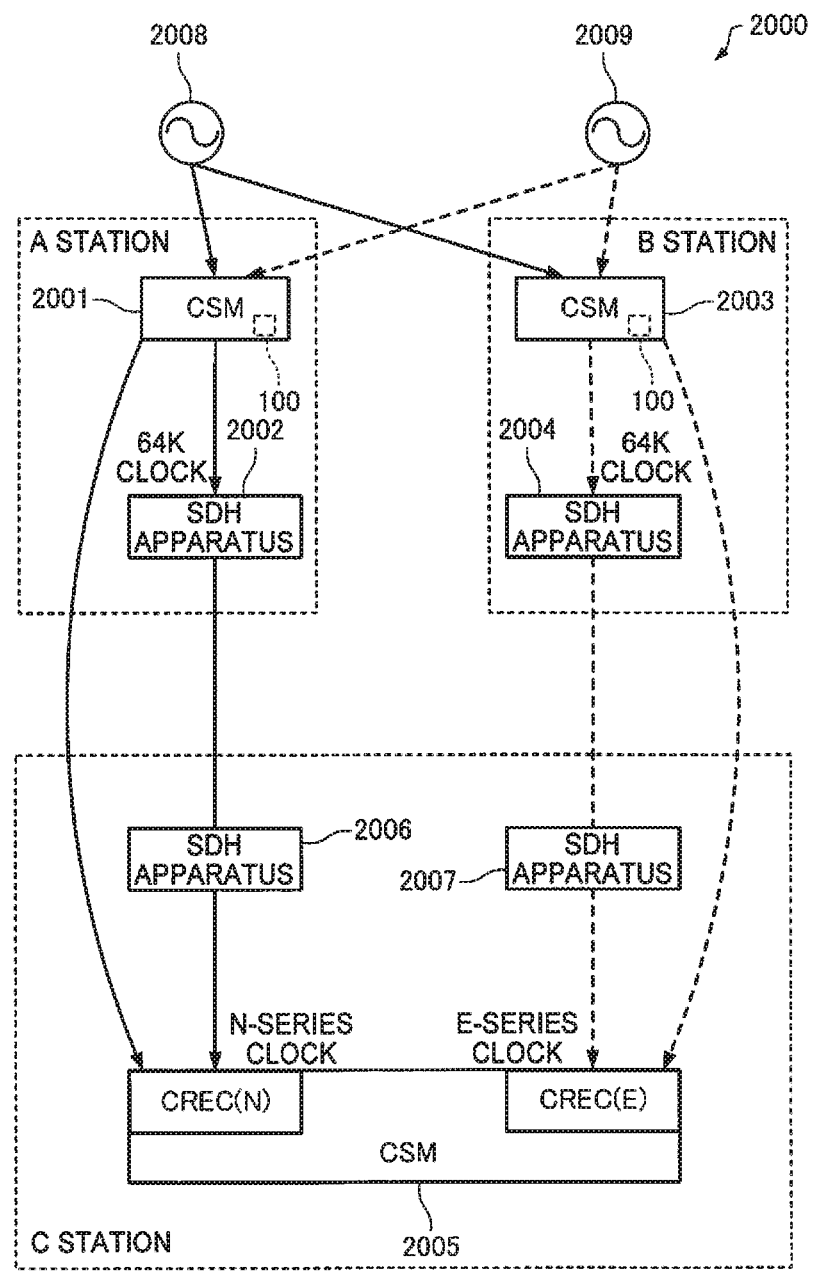
FIG. 8 is a diagram for explanation of an example of a system according to an embodiment.

FIG. 8 is a diagram for explanation of a clock transmission system 2000 as an example of the frequency signal generation system according to the embodiment.

The clock transmission system 2000 shown in FIG. 8 is a system having N (Normal)-series and E (Emergency)-series redundant configurations for synchronizing clocks of respective apparatuses within a time-division multiplexing network.

The clock transmission system 2000 includes a clock supply apparatus (CSM: Clock Supply Module) 2001 and an SDH (Synchronous Digital Hierarchy) apparatus 2002 of an A station (upstream (N-series)), a clock supply apparatus 2003 and an SDH apparatus 2004 of a B station (upstream (E-series)), and a clock supply apparatus 2005 and SDH apparatuses 2006, 2007 of a C station (downstream).

The clock supply apparatus 2001 has the atomic oscillator 100 and generates N-series clock signals. The atomic oscillator 100 within the clock supply apparatus 2001 synchronizes with higher-accuracy clock signals from master clocks 2008, 2009 including atomic oscillators using cesium and generates clock signals.

The SDH apparatus 2002 transmits and receives main signals based on the clock signals from the clock supply apparatus 2001, and superimposes the N-series clock signals on the main signals and transmit the signals to the downstream clock supply apparatus 2005.

The clock supply apparatus 2003 has the atomic oscillator 100 and generates E-series clock signals. The atomic oscillator 100 within the clock supply apparatus 2003 synchronizes with higher-accuracy clock signals from the master clocks 2008, 2009 including the atomic oscillators using cesium and generates clock signals.

The SDH apparatus 2002 transmits and receives main signals based on the clock signals from the clock supply apparatus 2003, and superimposes the E-series clock signals on the main signals and transmit the signals to the downstream clock supply apparatus 2005. The clock supply apparatus 2005 receives the clock signals from the clock supply apparatuses 2001, 2003 and generates clock signals in synchronization with the received clock signals.

Here, the clock supply apparatus 2005 normally generates clock signals in synchronization with the N-series clock signals from the clock supply apparatus 2001. Then, when an abnormality occurs in the N-series, the clock supply apparatus 2005 generates clock signals in synchronization with the E-series clock signals from the clock supply apparatus 2003. By the switching from the N-series to the E-series, stable clock supply may be secured and reliability of the clock path network may be made higher. The SDH apparatus 2006 transmits and receives main signals based on the clock signals from the clock supply apparatus 2005. Similarly, the SDH apparatus 2007 transmits and receives main signals based on the clock signals from the clock supply apparatus 2005. Thereby, the apparatus of the C station may be synchronized with the apparatus of the A station or B station.

The clock transmission system 2000 includes the atomic oscillator 100 with better frequency stability and has better reliability.

Note that the frequency signal generation system including the atomic oscillator of the invention is not limited to the positioning system and the clock transmission system, but may be applied to, for example, a cell phone, digital still camera, inkjet ejection device (e.g., inkjet printer), personal computer (mobile personal computer, laptop personal computer), television, video camera, video tape recorder, car navigation system, pager, personal digital assistance (with or without communication function), electronic dictionary, calculator, electronic game machine, word processor, work station, videophone, security television monitor, electronic binoculars, POS (Point Of Sale) terminal, medical device (e.g., electronic thermometer, sphygmomanometer, blood glucose meter, electrocardiographic measurement system, ultrasonic diagnostic system, or electronic endoscope), fish finder, various measuring instruments, meters and gauges (e.g., meters for vehicles, aircrafts, and ships), flight simulator, or the like.

3. Vehicle

Next, a vehicle according to the embodiment will be explained. The vehicle includes the atomic oscillator according to the invention. The vehicle including the atomic oscillator is not limited to an automobile, but may be applied to, for example, an aircraft such as a plane or helicopter, ship, rocket, artificial satellite, or the like.

The invention includes substantially the same configurations (e.g., configurations having the same functions, methods, and results or configurations having the same purposes and advantages) as the configurations explained in the embodiments. Further, the invention includes configurations in which non-essential parts of the configurations explained in the embodiments are replaced or omitted. Furthermore, the invention includes configurations that offer the same advantages or configurations that achieve the same purposes as those of the configurations explained in the embodiments. Moreover, the invention includes configurations in which known techniques are added to the configurations explained in the embodiments.

The entire disclosure of Japanese Patent Application No. 2017-188994 filed Sep. 28, 2017 is expressly incorporated by reference herein.

What is claimed is:

1. An atomic oscillator comprising:
   a semiconductor laser housed in a container;
   an atom cell housing alkali metal atoms and configured to be selectively irradiated with light from the semiconductor laser, the atom cell being located outside of the container;
   a light receiving element configured to detect an intensity of the light transmitted through the atom cell and to output a detection signal corresponding to the intensity;
   a temperature sensor housed in the container;
   a first temperature control element housed in the container and controlled in correspondence with the output of the temperature sensor; and
   a second temperature control element housed in the container and controlled in correspondence with the detection signal,
   wherein a shortest distance between the second temperature control element and the semiconductor laser is smaller than a shortest distance between the first temperature control element and the semiconductor laser.

2. The atomic oscillator according to claim 1, further comprising:
a light output control circuit configured to control the light output of the semiconductor laser by supplying a current to the semiconductor laser in correspondence with the detection signal; and
a wavelength control circuit configured to control an oscillation wavelength of the semiconductor laser by supplying a current to the second temperature control element in correspondence with the detection signal.

3. The atomic oscillator according to claim 1, wherein the second temperature control element is mounted on the first temperature control element, and
the semiconductor laser is mounted on the second temperature control element.

4. The atomic oscillator according to claim 1, wherein the first temperature control element is a Peltier element, and the second temperature control element is a heater.

5. The atomic oscillator according to claim 4, wherein the second temperature control element is on a temperature control surface of the first temperature control element, and
the semiconductor laser is on a surface of the second temperature control element opposite to the temperature control surface.

6. The atomic oscillator according to claim 1, wherein a heat capacity of the second temperature control element is smaller than a heat capacity of the first temperature control element.

7. An atomic oscillator comprising:
a container having a recessed base enclosed by a lid having a window;
a temperature sensor housed within the container;
a Peltier element mounted onto a bottom interior surface of the base within the container, the Peltier element being configured to be controlled in correspondence with an output of the temperature sensor;
a heater mounted atop the Peltier element within the container;
a semiconductor laser mounted atop the heater within the container and separated from the Peltier element by the heater, the semiconductor laser being optically aligned along an optical path with the window of the lid;
an atom cell positioned in radiation receiving relation to the semiconductor laser, the atom cell containing alkali metal atoms; and
a light detector configured to detect an intensity of light transmitted through the atom cell and to output a detection signal corresponding to the intensity,
wherein the heater is configured to be controlled in correspondence with the detection signal.

8. The atomic oscillator according to claim 7, further comprising:
a light output control circuit configured to control the light output of the semiconductor laser by supplying a current to the semiconductor laser in correspondence with the detection signal; and
a wavelength control circuit configured to control an oscillation wavelength of the semiconductor laser by supplying a current to the heater in correspondence with the detection signal.

9. The atomic oscillator according to claim 7, wherein a heat capacity of the heater is smaller than a heat capacity of the Peltier element.

10. The atomic oscillator according to claim 7, further comprising a metal layer interposed between an entirety of the heater and the Peltier element.

11. The atomic oscillator according to claim 7, wherein an entirety of the heater is within a periphery of the Peltier element.

12. The atomic oscillator according to claim 7, wherein the temperature sensor is mounted atop the Peltier element proximate the heater.

13. The atomic oscillator according to claim 7, wherein the semiconductor laser further comprises a VCSEL.

14. The atomic oscillator according to claim 7, wherein the temperature sensor further comprises one of a thermistor and a thermocouple.

15. The atomic oscillator according to claim 7, wherein the light detector further comprises one of a solar cell and a photodiode.

16. An atomic oscillator comprising:
a container having a recessed base enclosed by a lid, the recessed base having a step, the lid having a window;
a temperature sensor housed within the container, the temperature sensor being one of a thermistor and a thermocouple;
a Peltier element mounted directly onto a bottom interior surface of the base within the container, the Peltier element being configured to be controlled in correspondence with an output of the temperature sensor;
a metal layer disposed directly atop the Peltier element;
a heater mounted directly atop the metal layer within the container, an entirety of the heater being within a periphery of the Peltier element, the heater being one of a heating resistor and a ceramic heater;
a VCSEL mounted directly atop the heater within the container and separated from the Peltier element by the heater and the metal layer, the VCSEL being optically aligned along an optical path with the window of the lid;
a plurality of electrodes located along the step and respectively electrically connected to the Peltier element, the heater, the VCSEL and the temperature sensor;
an atom cell positioned in radiation receiving relation to the VCSEL, the atom cell containing alkali metal atoms; and
a light detector configured to detect an intensity of light transmitted through the atom cell and to output a detection signal corresponding to the intensity,
wherein the heater is configured to be controlled in correspondence with the detection signal.

17. The atomic oscillator according to claim 16, further comprising:
a light output control circuit configured to control the light output of the VCSEL by supplying a current via the electrodes to the VCSEL in correspondence with the detection signal; and
a wavelength control circuit configured to control an oscillation wavelength of the semiconductor laser by supplying a current via the electrodes to the heater in correspondence with the detection signal.

18. The atomic oscillator according to claim 16, wherein a heat capacity of the heater is smaller than a heat capacity of the Peltier element.

19. The atomic oscillator according to claim 16, wherein the temperature sensor is mounted atop the Peltier element proximate the heater.

20. The atomic oscillator according to claim 16, wherein the light detector further comprises one of a solar cell and a photodiode.

* * * * *